(12) United States Patent  
Bonora et al.

(10) Patent No.: US 7,771,151 B2
(45) Date of Patent: Aug. 10, 2010

(54) INTERFACE BETWEEN CONVEYOR AND SEMICONDUCTOR PROCESS TOOL LOAD PORT

(75) Inventors: Anthony C. Bonora, Fremont, CA (US); Michael Krolak, Fremont, CA (US); Roger G. Hine, Fremont, CA (US)

(73) Assignee: Muratec Automation Co., Ltd., Kyoto (JP)

( * ) Notice: Subject to any disclaimer, the term of this patent is extended or adjusted under 35 U.S.C. 154(b) by 1121 days.

(21) Appl. No.: 11/178,072

(22) Filed: Jul. 8, 2005

(65) Prior Publication Data

US 2006/0257233 A1    Nov. 16, 2006

Related U.S. Application Data

(60) Provisional application No. 60/681,354, filed on May 16, 2005.

(51) Int. Cl.
*H01L 21/68* (2006.01)
(52) U.S. Cl. ........... 414/217.1; 74/490.01; 414/733; 414/940; 901/15
(58) Field of Classification Search ........... 414/217.1, 414/733, 940; 74/490.01; 901/15
See application file for complete search history.

(56) References Cited

U.S. PATENT DOCUMENTS

| | | | | |
|---|---|---|---|---|
| 4,964,776 A | * | 10/1990 | Wakita et al. | 414/277 |
| 6,224,313 B1 | * | 5/2001 | Fukushima et al. | 414/280 |
| 6,364,593 B1 | * | 4/2002 | Hofmeister et al. | 414/217.1 |
| 6,655,901 B2 | * | 12/2003 | Tsubota et al. | 414/744.5 |
| 7,066,707 B1 | * | 6/2006 | Bonora et al. | 414/744.3 |
| 2001/0041129 A1 | * | 11/2001 | Tsuneda et al. | 414/744.1 |
| 2002/0197136 A1 | | 12/2002 | Huang et al. | |
| 2003/0029696 A1 | * | 2/2003 | Hirata et al. | 198/358 |
| 2003/0145674 A1 | * | 8/2003 | Weaver | 74/490.01 |
| 2005/0008467 A1 | | 1/2005 | Huang et al. | |
| 2006/0188360 A1 | * | 8/2006 | Bonora et al. | 414/217.1 |

FOREIGN PATENT DOCUMENTS

| | | | |
|---|---|---|---|
| JP | 5-190648 | * | 7/1993 |
| JP | 11 214476 A | | 8/1999 |
| WO | 91/11299 | * | 8/1991 |

OTHER PUBLICATIONS

Patent Abstract of Japan, Nov. 30, 1999, vol. 1999, No. 13, Abstract.

* cited by examiner

*Primary Examiner*—James Keenan
(74) *Attorney, Agent, or Firm*—Fish & Richardson P.C.

(57) ABSTRACT

The present invention generally comprises a tool load device for transferring a container between a container transport system and a processing tool. The tool load device may service a single load port or multiple load ports. Regardless, the tool load device is preferably located between the load port of the processing tool and the section of the container transport system passing the processing tool. The tool load device provides an improved method of moving containers between a conventional load port and, for example, a conveyor. In another embodiment, the tool load device is coupled with an x-drive assembly that moves the tool load device along a path that is substantially parallel to the container transport system passing in front of the load port—allowing the tool load device to service multiple load ports.

4 Claims, 15 Drawing Sheets

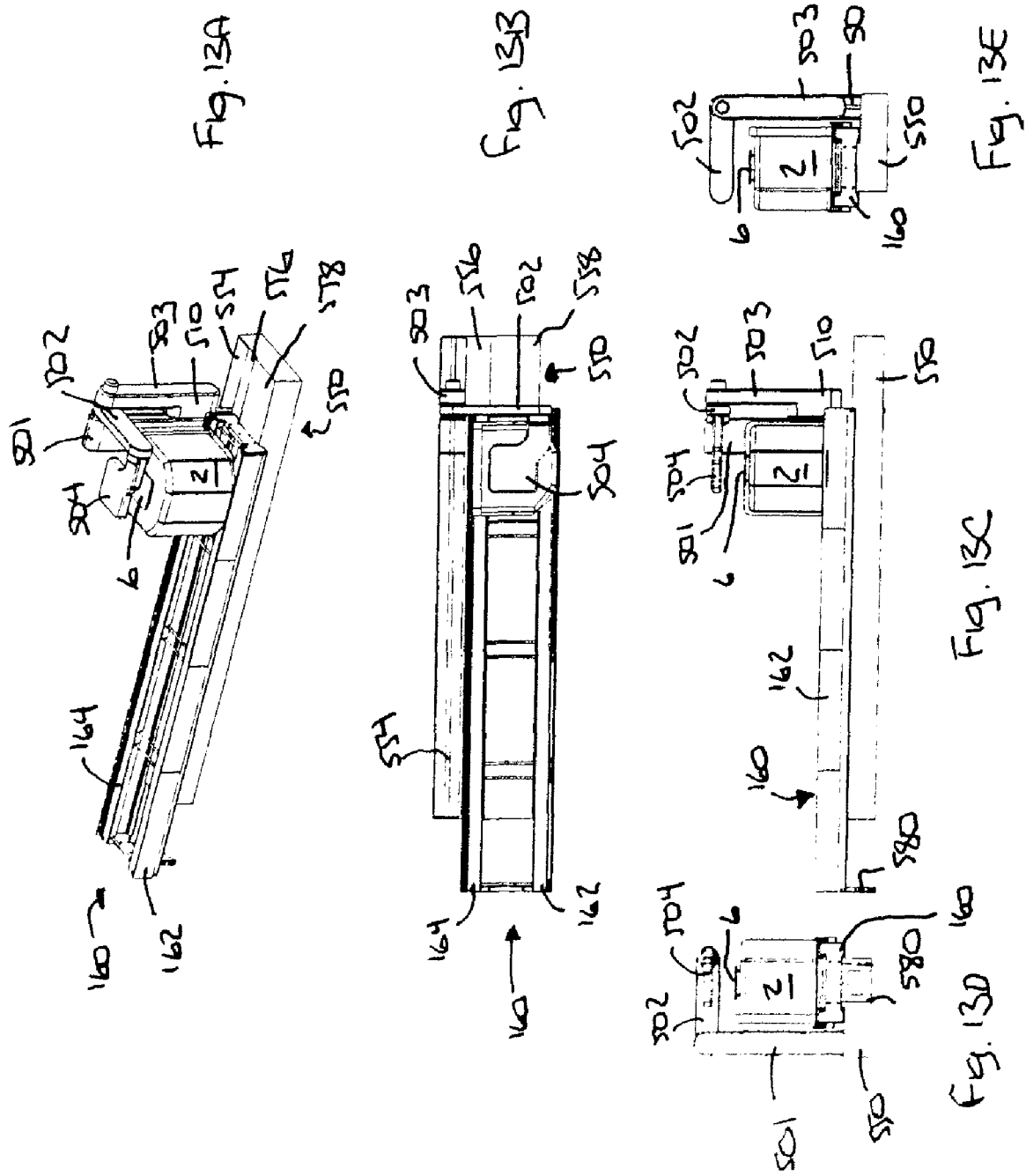

INTERFACE BETWEEN CONVEYOR AND SEMICONDUCTOR PROCESS TOOL LOAD PORT

CLAIM OF PRIORITY

This application claims priority pursuant to 35 U.S.C. §119 (e) to U.S. Provisional Application Ser. No. 60/681,354, entitled "Interface Between Conveyor and Semiconductor Process Tool Load Port," which was filed with the U.S. Patent and Trademark Office on May 16, 2005.

FIELD OF THE INVENTION

The present invention generally comprises a transfer mechanism for transferring containers between a material handling system and a processing tool.

BACKGROUND

It is costly to deliver containers, such as Front Opening Unified Pods (FOUPs) and Standard Mechanical Interface (SMIF) pods, to processing tools and load ports in a semiconductor fabrication facility. One method of delivering FOUPs or bottom opening containers between processing tools is an overhead transport (OHT) system. The OHT system lowers a FOUP onto the kinematic plate of the load port at approximately 900 mm height from the fabrication facility floor. An OHT system uses sophisticated ceiling mounted tracks and cable hoist vehicles to deliver FOUPs to, for example, a load port of a processing tool. The combination of horizontal moves, cable hoist extensions, and unidirectional operation, must be coordinated for transporting FOUPs quickly between processing tools. A transport vehicle must be available at the instant when a processing tool needs to be loaded or unloaded for best efficiency.

OHT systems are often mounted on portions of a facility ceiling, and therefore, are located above the processing tools and load ports. OHT systems utilize free space in the fabrication facility as the processing tools are typically floor mounted equipment. Ceiling mounted OHT systems must raise or lower a container a substantial distance between the OHT track and, by way of example only, a load port. An OHT system preferably has a very high cleanliness performance because any particles created from moving FOUPs along the track may fall onto the tool areas located underneath and potentially damage wafers.

Rail guided vehicles (RGVs) and automatic guided vehicles (AGVs) are often utilized in semiconductor fabrication facilities to move containers along the facility floor between processing tools. RGV's and AGV's are easier to access for maintenance purposes than an OHT system and are typically less costly than ceiling mounted OHT systems. Particle control is also simplified because particles generated by an RGV or AGV remain below the datum plane of a load port. RGVs and AGVs, however, occupy valuable floor space—which is at a premium in a semiconductor fabrication facility—and pose safety issues (e.g., tool operators and RGV's operate in the same space).

An example of an interface between an Automated Material Handling System (AMHS) conveyor in a semiconductor fabrication facility and a process tool is described and claimed in U.S. patent application Ser. No. 11/064,880, entitled "Direct Tool Loading," which is assigned to Asyst Technologies, Inc, and is incorporated by reference herein. For example, one embodiment of the Direct Tool Loading invention includes a conveyor that delivers semiconductor material containers to a process tool. The conveyor is preferably located below the kinematic plate of the load port. In a preferred embodiment, the kinematic plate moves substantially vertically to move a container between the conveyor and a position where the process tool can access the materials located in the container.

Not every processing tool will be able to, or will require, use of a Direct Load load port. In fact, there likely will be a need to interface a floor mounted conveyor to a conventional load port such as, by way of example only, the load port disclosed in U.S. Pat. No. 6,419,438, entitled "FIMS Interface Without Alignment Pins," which is assigned to Asyst Technologies, Inc., and is incorporated by reference herein. A standard load port can conform to the SEMI BOLTS interface standard but is not limited by all of the BOLTS requirements such as the single piece, front mounting plate. The standard loadport referred to in this description could have separate modules for the port door, door lift, or kinematic plate assembly. The important requirement is that the loadport's kinematic plate can receive the container in the manner described by the SEMI standard.

This is a description of an invention that facilitates the loading of containers from the above-described conveyor to a standard loadport on a process tool. The conveyor could also be mounted slightly above the floor or below the floor in this invention.

SUMMARY OF THE INVENTION

One aspect of the present invention is to provide a tool load device that may be placed between a material transport system and a conventional load port. In one embodiment, the tool load device is located between a floor mounted conveyor and a load port of a processing tool. In another embodiment, the tool load device is located between the path of an AGV and a load port of a processing tool. In another embodiment, the tool load device is located between the rail of an RGV and a load port of a processing tool.

Another aspect of the present invention is to provide a tool load device that may service a single load port or multiple load ports. In one embodiment, the body of the tool load device is stationary and may only service a single load port. In another embodiment, the body of the tool load device is coupled with an x-drive assembly so that the tool load device may move laterally between multiple load ports.

Yet another aspect of the present invention is to provide a tool load device that moves containers between a load port and a material transport system efficiently. In one embodiment, the tool load device includes a single rigid structure that, through substantially only motion along a z-axis and a theta axis, transfers a container between the load port and conveyor. In another embodiment, the tool load device includes an arm that rotates about a vertically adjustable shoulder to move a container between a load port and a material transport system.

Still another aspect of the present invention is to provide a tool load device that easily integrates with existing material transport systems. In one embodiment, the tool load device is coupled with an x-drive assembly that also supports a section of the material transport system—providing for easy installation of the tool load device. For example, the x-drive assembly is enclosed within a housing that supports a material transport system traveling over the x-drive assembly.

Another aspect of the present invention is to provide a tool load device that allows an OHT system, or other material transport system, to place/remove a container from the tool load device. For example, the tool load device may support a container by the container's bottom surface whereby an OHT system may place a container on the tool load device in a stand-by position.

BRIEF DESCRIPTION OF THE DRAWINGS

FIGS. 13A-13E each provides various views of the invention shown in FIG. 12, illustrating the relationship between the x-axis drive assembly and the container transport system.

DETAILED DESCRIPTION OF THE INVENTION

Semiconductor Equipment and Materials International (SEMI) has created standards for semiconductor wafer manufacturing equipment (see http://www.semi.org). The SEMI Standards govern acceptable tolerances and interfaces for semiconductor manufacturing equipment. The inventions described herein are not limited to semiconductor manufacturing equipment for handling FOUPs.

By way of example only, the various embodiments of the present invention may also be used and/or adapted for systems handling SMIF pods, reticle containers, flat panel display transport devices, or any other front opening or bottom opening container or processing tool. Container is defined as any type of structure for supporting an article including, but not limited to, a semiconductor substrate. By way of example only, a container includes a structure that comprises an open volume whereby the article can be accessed (e.g., FPD transport) or a container having a mechanically openable door (e.g., bottom opening SMIF pod and FOUP). Load port is defined as interface equipment that handles containers. For purposes of describing this invention, however, only load ports for handling FOUPs and bottom opening containers will be referenced herein.

Figure 1:
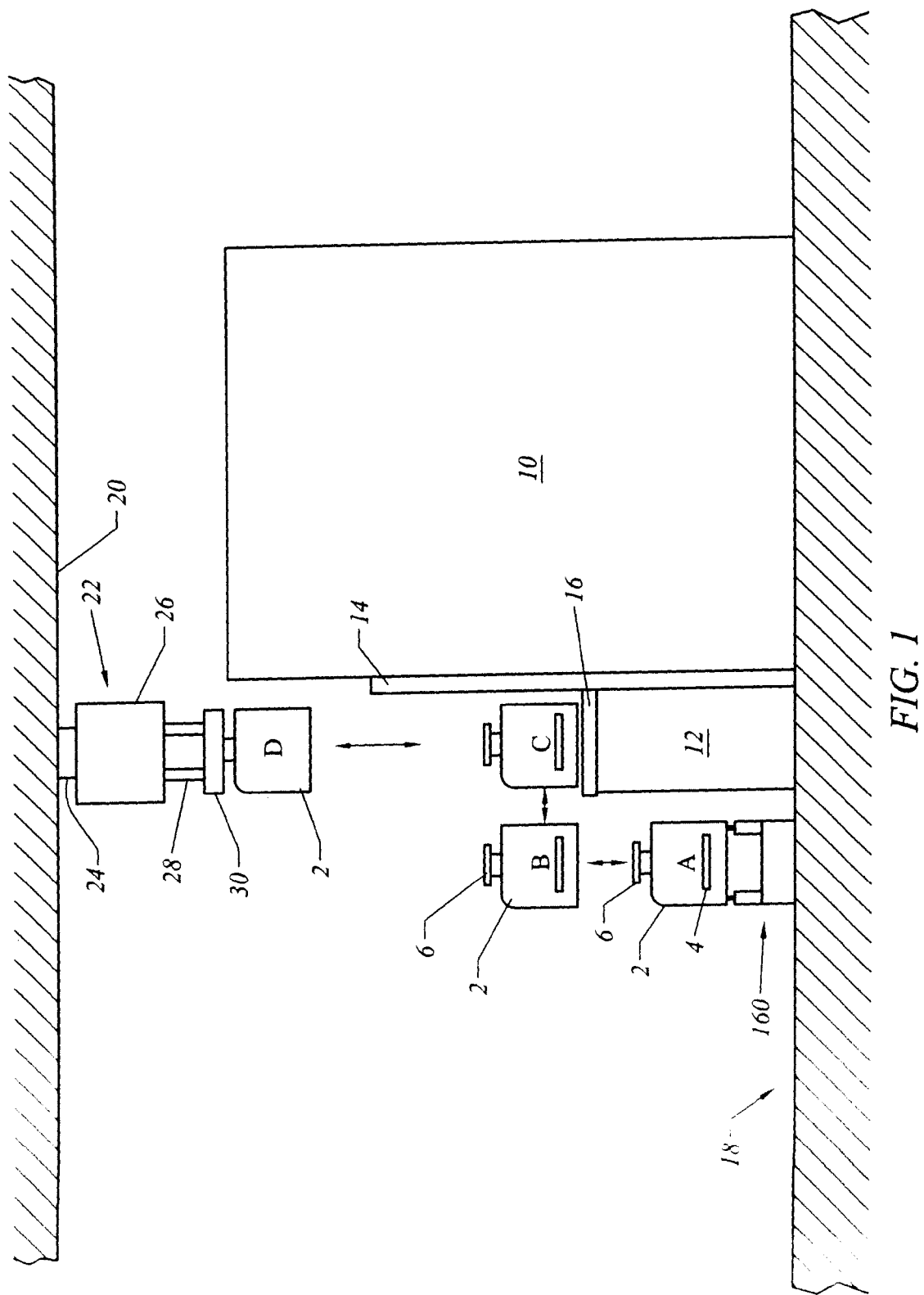
FIG. 1 provides a schematic drawing of an embodiment of the present invention.
Figure 2:
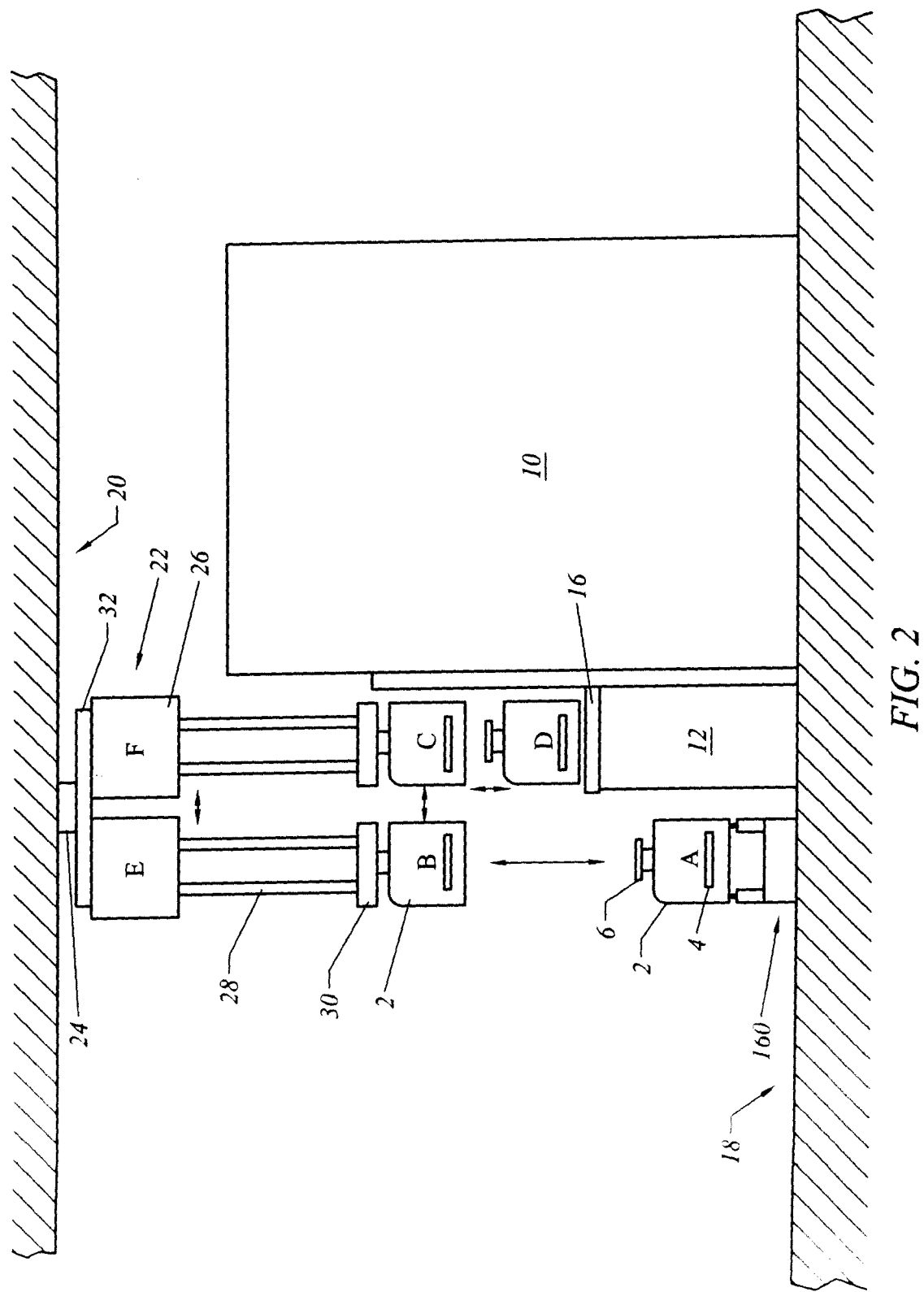
FIG. 2 provides a schematic drawing of another embodiment of the present invention, illustrating an hoist with Y-axis motion.
Figure 3:
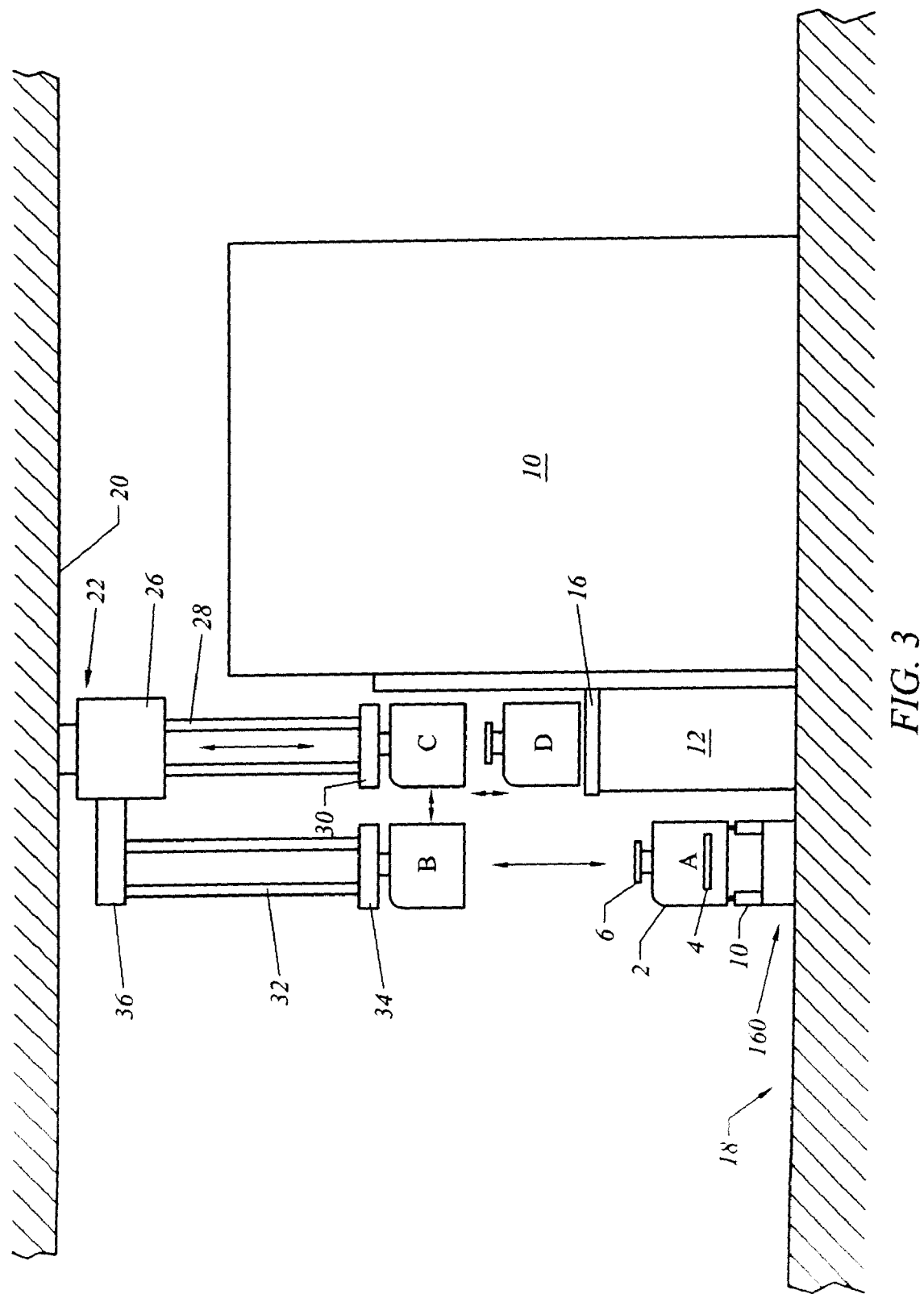
FIG. 3 provides a schematic drawing of yet another embodiment of the present invention, illustrating a hoist having a cantilevered second hoist mechanism.

FIGS. 1-3 generally illustrate various systems for moving a container between a floor-mounted conveyor and a load port of a processing tool. Each system in FIGS. 1-3 demonstrates moving a container between four main locations—positions A, B, C and D. These locations are used throughout this application to describe the various embodiments of the present invention.

FIG. 1 shows the FOUP 2 seated on the conveyor 160 (position A), seated on a kinematic plate 16 of a load port 12 (position C) and gripped by an overhead transport (OHT) vehicle 22 (position D). Position C represents either an intermediate transfer step between the conveyor 160 and the load port 12 or a FOUP storage location (see FIG. 10). A single container transfer device (e.g., robot), which will be described later (see FIGS. 4-7), preferably moves the FOUP 2 between positions A, B and C.

In this embodiment, the processing tool 10 and the conveyor 160 are each floor-based elements. The conveyor 160 shown in FIG. 1 is merely representative. A floor-based conveyor generally represents any container transport system (e.g., conveyor, AGV, RGV, etc.) that transports a container at an elevation that is lower than the loading height for the processing tool 10. A conventional load port 12 is mounted to the processing tool 10. Each of these elements may also be located in other positions in the facility (e.g., the conveyor 160 may be located under the facility floor 18, raised above the floor, etc.). The OHT vehicle 22 preferably moves along a drive rail 24 that is affixed to the facility ceiling 20. FIG. 1 illustrates that the OHT drive rail 24, in this embodiment, is oriented along an x-direction (e.g., parallel to the conveyor 160). The OHT vehicle 22 includes a gripping mechanism 30 for securing the FOUP 2 by the FOUP's top handle 6. It is within the scope of the present invention to secure the FOUP by, for example, the FOUP's side handles 4 or bottom flange. The OHT vehicle 22 moves the gripping mechanism 30 vertically by retractable suspension cables 18. For the purpose of describing the invention only, retractable cables may include, but are not limited to, cables, belts, bands or any combination of these items.

A conventional load port 12 often includes a kinematic plate 16 having kinematic pins to align the FOUP on the plate. These kinematic pins extend upward from the kinematic plate 16. The bottom surface of a FOUP includes three alignment receptacles for accepting the kinematic pins when the FOUP 2 is set on the kinematic plate 16. Thus, the FOUP 2 must be approximately aligned with the kinematic pins before the FOUP 2 is set on the kinematic plate 16. The FOUP transfer device may be adapted to move a FOUP 2, located at position C, vertically in order to place or remove a FOUP 2 from the kinematic pins.

Each FOUP transfer device may also move a FOUP 2 between position B and position C along any number of paths of motion. For example, a path of motion may be a non-linear arc (see FIG. 5) or along a substantially linear path (See FIG. 6). Regardless, the transfer device may secure a FOUP 2, by way of example only, the FOUP's top handle 6, side brackets 22, side edges of the FOUP's bottom plate, or the bottom of the FOUP (e.g., adjacent to the side edges outside of the area of the kinematic pin supports). Each method of securing a FOUP 2 preferably does not obstruct the alignment features on the bottom of the FOUP so that a FOUP can be transferred directly from the conveyor 160 to the kinematic plate 16 of the load port 12—where the FOUP rests on its bottom surface.

The container transfer device may also have a stand-by position—position B for example —where the device idles without a FOUP (e.g., the device is not moving a container between positions A, B or C). This stand-by position would allow an operator or delivery vehicle to deliver a FOUP onto the transfer device in a convenient location—over the conveyor. For example, an operator would not have to reach over the conveyor 10 in order to place a FOUP on the load port 12. Instead, the operator could place the FOUP on a storage shelf or the container loading device itself, which is located directly over the conveyor 160.

The OHT system 22 provides an additional method of delivering FOUPs to the load port 12 of the processing tool 10—increasing throughput of the facility. FIG. 1 illustrates an OHT vehicle 26 aligned substantially vertically with the tool's load port 12. The OHT system 22 includes a rail 24 affixed to the facility ceiling 20, an OHT car 26 for traveling along the rail 24 and a gripper 30 that is raised and lowered by cables 28. Aligning the OHT system 22 with the load port 12 allows the OHT system 22 to lower a FOUP 2 directly onto the kinematic plate 16 and/or remove a FOUP 2 from the kinematic plate 16.

It is within the scope of the invention for the processing tool to include a load port similar to the load port disclosed in U.S. application Ser. No. 11/064,880, entitled "Direct Loading Tool," which is assigned to Asyst Technologies, Inc. and is incorporated by reference herein. If a Direct Loading Tool was used, the FOUP advance plate of the Direct Loading Tool may also be served by the OHT system 22.

FIG. 2 illustrates another embodiment of an OHT system 22 that may operate with the present invention. In this embodiment, the OHT system 22 includes a Y-axis drive 32 for moving the OHT car 26 between position E and position F. The OHT system 22 is positioned to remove and place a FOUP 2 on the conveyor 160 while the OHT car 26 is located in position E. The OHT system 22 is positioned to remove and place a FOUP 2 on the load port 12 while the OHT car 26 is located in position F.

In operation, the OHT system 22 moves a FOUP 2 between the conveyor 160 and the processing tool 10 by picking up a FOUP 2 at position A, lifting the FOUP 2 to position B, moving the FOUP 2 horizontally to position C, and finally lowering the FOUP 2 onto the load port 12 (position D). These positions A-D are representative only. The actual positions A-D may vary (e.g., the container may be initially raised from the conveyor to a position B that is a higher elevation than shown in FIG. 2). The reverse sequence of motion (e.g., position D to position C to position B to position A) transfers a FOUP 2 from the load port 12 back to the conveyor 160. The path between these positions may be accomplished in any way known within the art. For example, it is possible that some or all of the paths of motion may overlap—creating a curved path of motion between position A and position D. Each path of motion does not have to be a distinct and separate path. In fact, overlapping paths of motion between positions may reduce the overall transfer time between the load port 12 and the conveyor 160.

FIG. 2 illustrates that, in a preferred embodiment, the bottom surface of a FOUP 2, located in either position B or position C, is located at a higher elevation than the top handle 6 of a FOUP 2 located in position D. This feature is not, however, necessary for transferring a FOUP 2 between the load port 12 and the conveyor 160. In fact, the height of the FOUP's bottom surface, while moving from position C to D, only needs to be high enough to clear any obstructions on the kinematic plate such as the kinematic pins (not shown) or other alignment features.

FIG. 3 illustrates that an OHT vehicle 22 may include a cantilevered mechanism 36 for supporting retractable cables 32. The mechanism 36 is mounted to a OHT car 26 that provides limited motion along a y-axis. This OHT system 22 is used, for example, to access ceiling mounted container storage shelves or make slight adjustments for load port alignment. A conventional OHT hoist could be adapted by either mounting the OHT hoist on a dedicated x-drive mechanism or as part of a bay or fab wide OHT system. Many of the conventional OHT vehicles include a y-mechanism that includes additional features and complexities that are not necessary for the purpose of transferring a FOUP between a conveyor and a load port. These features can increase cost and degrade reliability, but may be acceptable as an interim loading method.

Figure 4:
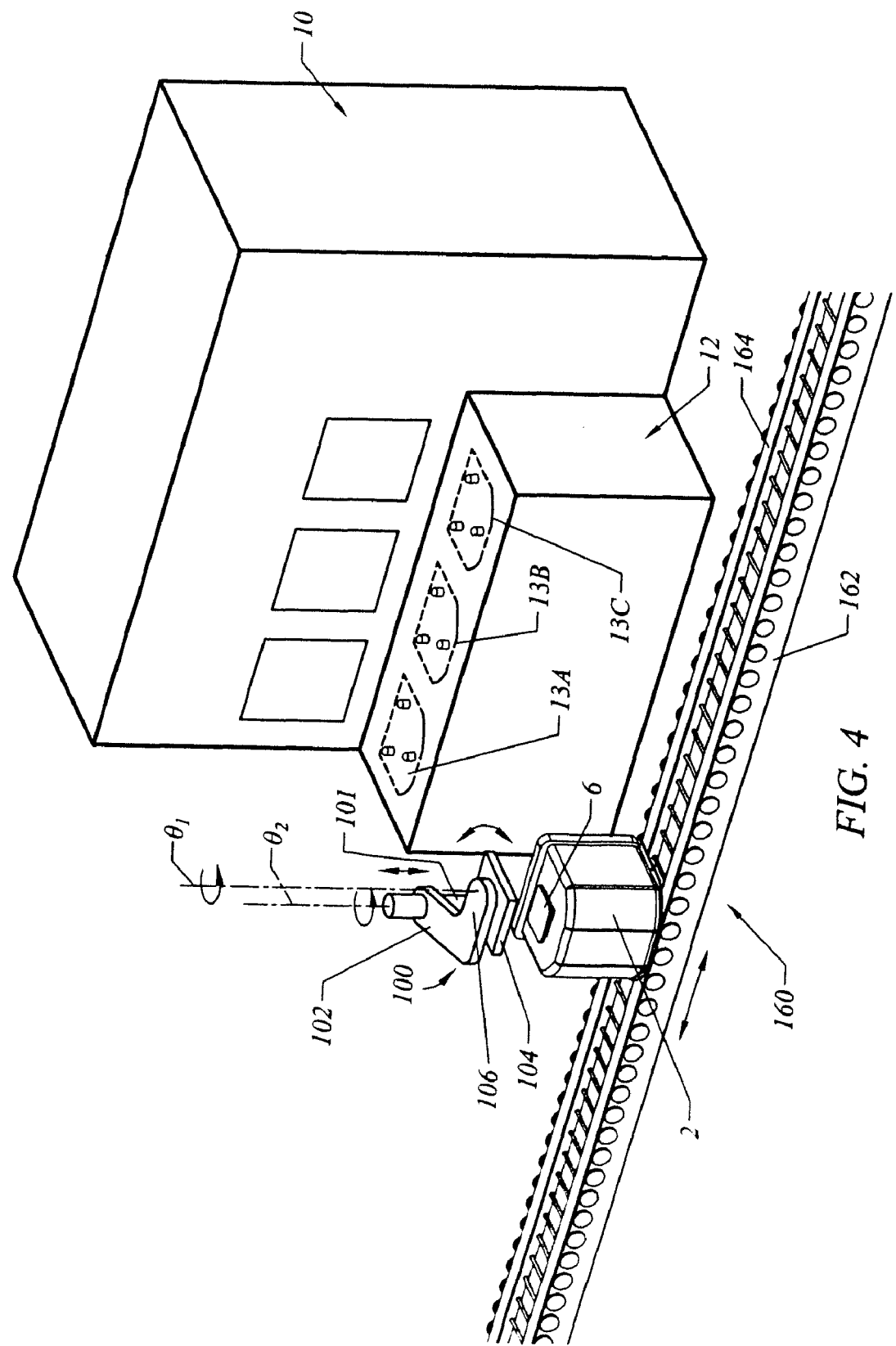
FIG. 4 provides a perspective view of an embodiment of the present invention, illustrating an embodiment of a transfer arm mechanism.

FIGS. 4, 5, 6 and 7 illustrate several embodiments of a container transfer device 100 for transporting a FOUP 2 between a conveyor 160 and a load port 12. FIG. 4 illustrates a first embodiment of a container transfer device 100. The container transfer device 100 includes, among other things, a body 101, and arm 102 and a gripper 104. The proximal end of the arm 102 is rotatably mounted to the body 101 and rotates about a $\theta_2$ axis. The gripper 104 is rotatably mounted to the distal end of the arm 102 and rotates about a $\theta_1$ axis. The device 100 moves a FOUP 2 between the conveyor 160 and the load port 12 by coordinating vertical motion along the z-axis, and the rotational motion about the $\theta_2$ axis and the $\theta_2$ axis, of the arm 102.

The embodiments of the container transfer device 100, for discussion purposes only, moves FOUPs between processing tool 10 and a conveyor 160. It is within the scope of the invention to transport FOUPs throughout the facility by other transport systems known within the art (e.g., RGV, AGV, etc.). FIG. 4 shows a conveyor 160 having a first rail 162 and a second rail 164. It is within the scope of the present invention to use other types of conveyors such as, but not limited to, a belt conveyor. Regardless, the conveyor preferably may move a FOUP 2 in both an upstream direction and a downstream direction (as indicated by the arrow in FIG. 4).

The FOUP transfer device 100 may be located anywhere along the conveyor 160 that requires a pick-and-place device (e.g., adjacent a stocker, a metrology tool, a storage shelf, etc.). The body 101 is preferably located between the load port 12 and the conveyor 160. In one embodiment, the body 101 of the FOUP transfer device 100 moves along an x-axis (e.g., parallel to the conveyor 160) in both an upstream and downstream direction between the conveyor 160 and the load ports 12 to service all three kinematic plates 13A-13C. The body 101 may also be mounted to the facility floor, creating a transfer device that only services a single kinematic plate 13. The container transfer device 100 may also be located on the opposite side of the conveyor 160—adjacent rail 162. If the container transfer device 100 is located between the conveyor 160 and the load port 12, the transfer device 100 is preferably as compact as possible to minimize the distance that the load port 12 is set back from the conveyor 160.

The arm 102 shown in FIG. 4 comprises a single rigid structure. However, the arm 102 may also comprise more than one segment that may or may not have a uniform elevation. In a preferred embodiment, the gripper 104 is rotatably mounted to the distal end 106 of the arm 102. The gripper 104 may be affixed to other portions of the arm 102. Allowing the gripper 104 to rotate allows the transfer device 100 to maintain the FOUP door substantially parallel with the front surface of the tool as the transfer device 100 moves the FOUP 2 between the conveyor 160 and the load port 12. A rotating gripper also allows the transfer device 100 to align a FOUP 2 with the kinematic pins before the FOUP 2 is set down on the kinematic plate 13. For example, a FOUP 2 may travel along the conveyor 160 with the FOUP door facing the direction of travel. In this case, the FOUP transfer device 100 must rotate the FOUP 90° so that the FOUP door faces the port door before the transfer device 100 may set the FOUP 2 on the load port 12.

A FOUP 2 moves between the conveyor 160 and the load port 12 along, for example, a fluid arc (e.g., non linear path) or linear movement between each location (e.g., from position A to position B to position C) by coordinating the x-axis motion, the z-axis motion and rotation about the $\theta_1$ and $\theta_2$ axes. The container transfer device 100 may service only a single load port or may service multiple load ports. To service multiple load ports, the device 100 is mounted on an x-axis drive (not shown) such that the body 101 moves substantially parallel to the conveyor within the space located between the load port and the conveyor. If the transfer device 100 was mounted on such a drive, the transfer device 100 may move a FOUP 2 between the conveyor 160 and any of the kinematic plates 13A, 13B or 13C. The container transfer device 100 may also load/unload a FOUP from other transport devices such as, but not limited to, an RGV, AGV or PGV.

Figure 5:
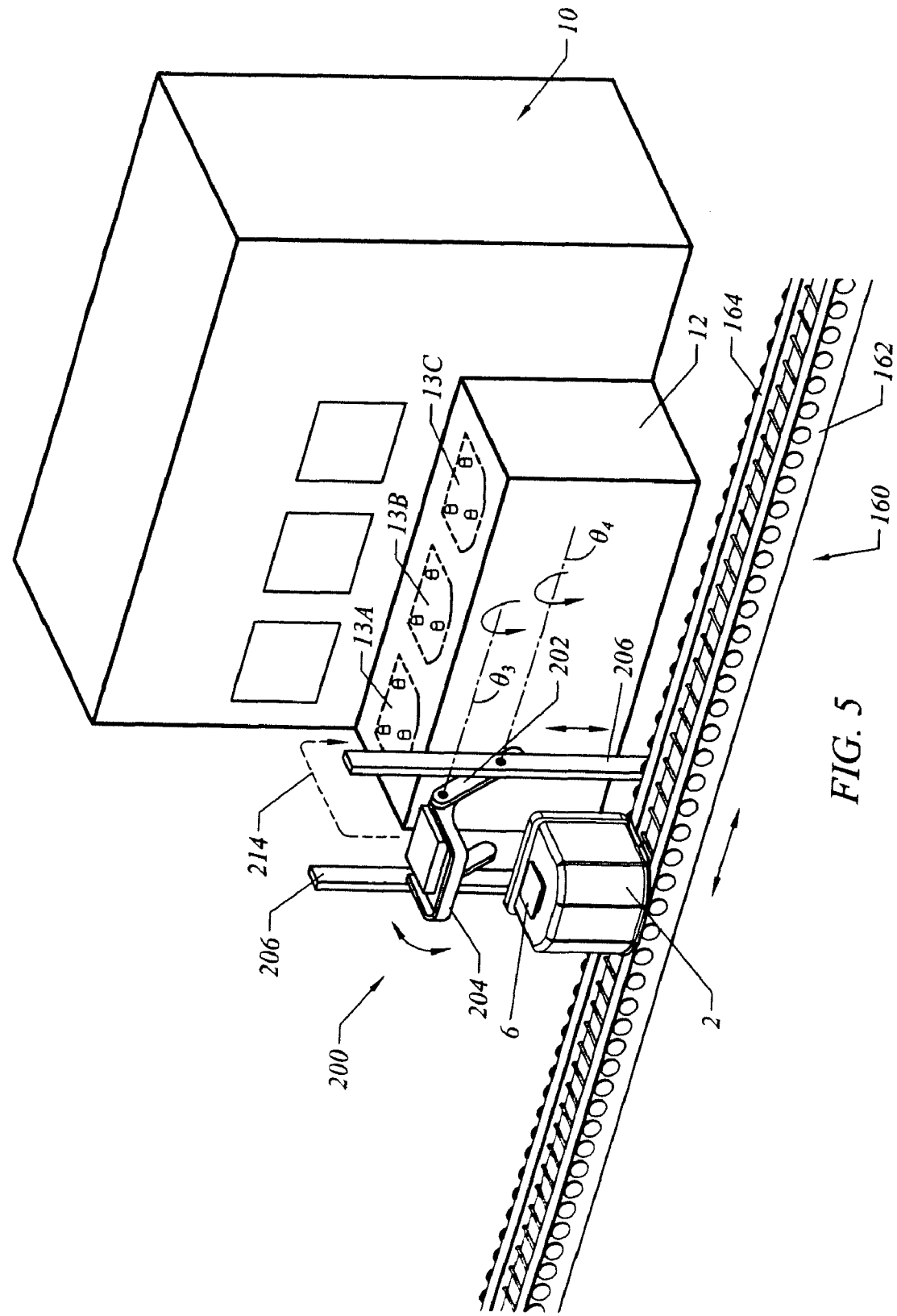
FIG. 5 provides a perspective view of an embodiment of the present invention, illustrating another embodiment of a transfer arm mechanism.

FIG. 5 illustrates a container transfer device 200. In this embodiment, the container transfer device 200 includes a pair of vertical supports 206, a pair of arms 202 each rotatably affixed to a vertical support 206 and a gripper 204. The gripper 204, in this embodiment, is rotatably affixed to a distal end 208 of each arm 202 rotating about a $\theta_3$ axis. Each arms 202 rotates about a $\theta_4$ axis 212 with respect to the vertical supports 206. The arms 202 move vertically up and down the vertical supports 206, by way of example only, a lead screw. Other mechanisms for raising/lowering the gripper 204 are within the scope of the present invention. The number of rotating arms and vertical supports may vary and are not limited to the embodiment shown in FIG. 5.

A FOUP 2, secured by the gripper 204, is transferred between the conveyor 160 and the load port 12 along an arc 214 (shown as a dashed line). The coordinated motion along the z-axis and the rotational motion about the $\theta$ axes may create any number of arcs or paths of motion between the conveyor and the load port. This motion is achieved by the rotating supports 202 and gripper 204 rotating about their respective $\theta_3$ axis and $\theta_4$ axis in combination with the vertical motion of the arms 202. It is within the scope of the present invention for a single motor mechanism to control the motion about the $\theta_3$ axis and $\theta_4$ axis or to have a single motor control both axes.

Figure 6:
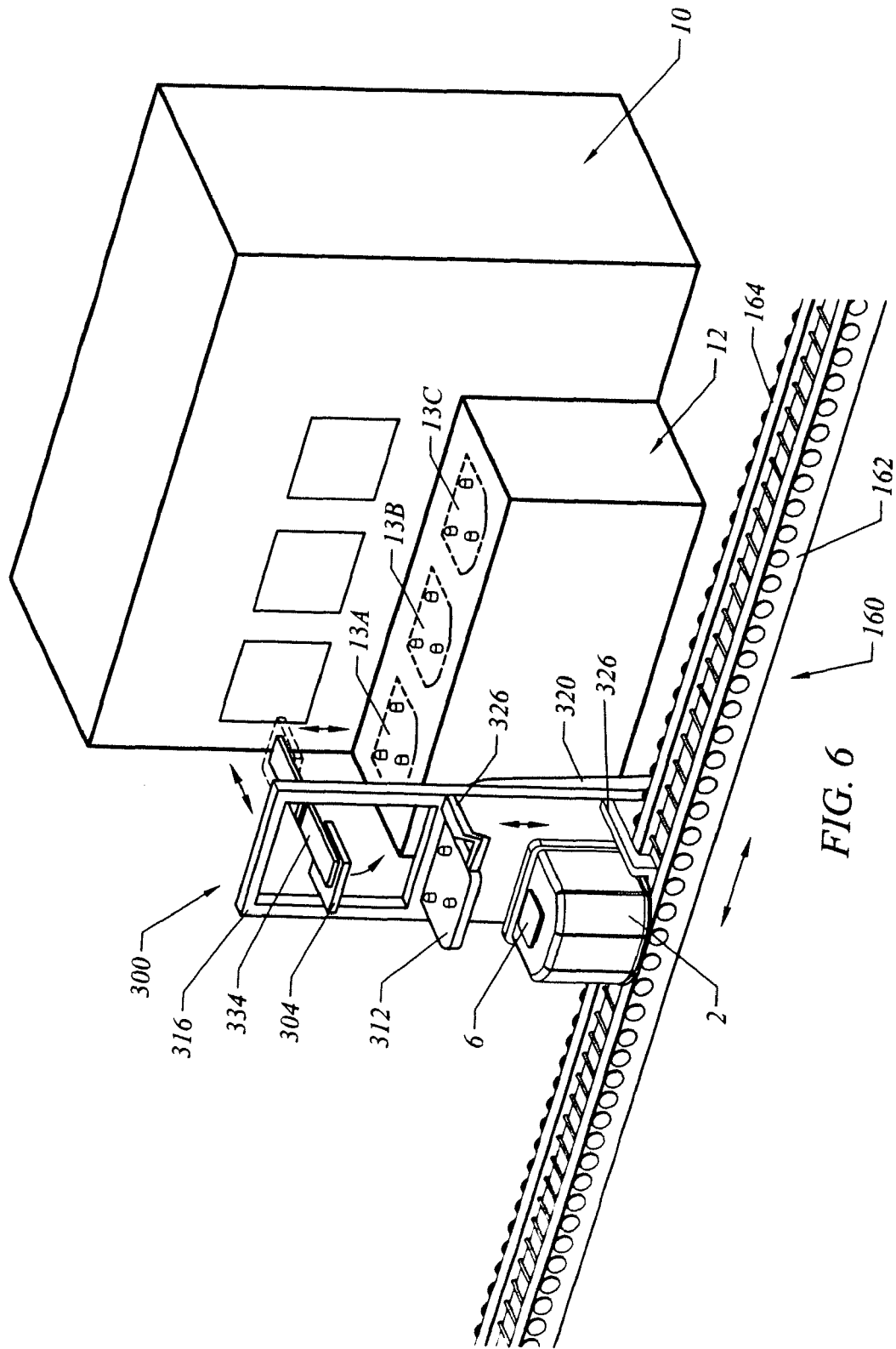
FIG. 6 provides a perspective view of an embodiment of the present invention, illustrating yet another embodiment of a transfer arm mechanism.

FIG. 6 illustrates a container transfer device 300. In this embodiment, a transfer mechanism 334 is integrated into an embodiment of the load port disclosed in U.S. application Ser. No. 11/064,880, entitled "Direct Loading Tool," which is assigned to Asyst Technologies, Inc. and is incorporated by reference herein. The transfer device 300 includes many of the features of the Direct Loading Tool load port—a kinematic plate 312 and a drive assembly 320 for moving the kinematic plate 312 vertically between the conveyor 160 and an opening 314 in the plate 316. The slide mechanism 334 may include, by way of example only, a lead screw, a pulley, a belt drive and the like for moving the gripper 304.

Similar to the Direct Loading Tool, the plate 316 is located substantially within a vertical plane between the conveyor 160 and the load port 12. The kinematic plate 312, when moved to a lowered position (as shown in FIG. 6), nests between the conveyor rails 162, 164. The embodiment shown in FIG. 6 includes a cantilevered arm 326 that will prevent a FOUP traveling along the conveyor 160 to pass unobstructed by the device 300. However, it is within the scope of the present invention that the arm 326 may also have a configuration (e.g., the arm 326 passes through rail 164 of the conveyor 160) that allows a FOUP 2 traveling along the conveyor 160 to pass unobstructed over the kinematic plate 312.

A transfer mechanism 334 is affixed to the plate 316—extending through the opening 314. The mechanism 334 includes, among other things, a gripper 304 that slides along a track 336 between the kinematic plate 312 and the kinematic plate 13. The gripper 304 secures the FOUP 2 by the FOUP's top handle 6. The FOUP 2 may also be secured by the gripper 304 by other FOUP features including the FOUPs side handles 4 or bottom surface. The gripped 304 may also move vertically to raise/lower a FOUP onto a kinematic plate.

In operation, the drive assembly 320 first moves the kinematic plate 312 down to the conveyor 160. When a FOUP comes to rest over the kinematic plate 312, the drive assembly 320 raises the kinematic plate 312, which lifts the FOUP 2 off the conveyor 160 and up to the opening 314. The gripper 304 then moves down slightly, grips the top handle 6 of the FOUP. The gripper 304 then moves up lifting the FOUP 2 off of the kinematic plate 312. The gripper 304 then moves the FOUP horizontally to a position over the kinematic plate 13 and the gripper 304 lowers the FOUP onto the kinematic plate 13.

The plate 316 may be mounted on a mechanism that moves the entire FOUP transfer device 300 along an x-axis (e.g., parallel with the conveyor) to service all three kinematic plates 13A, 13B and 13C. Or the plate 316 may comprise a stationary structure that only services a single kinematic plate 13.

Figure 7:
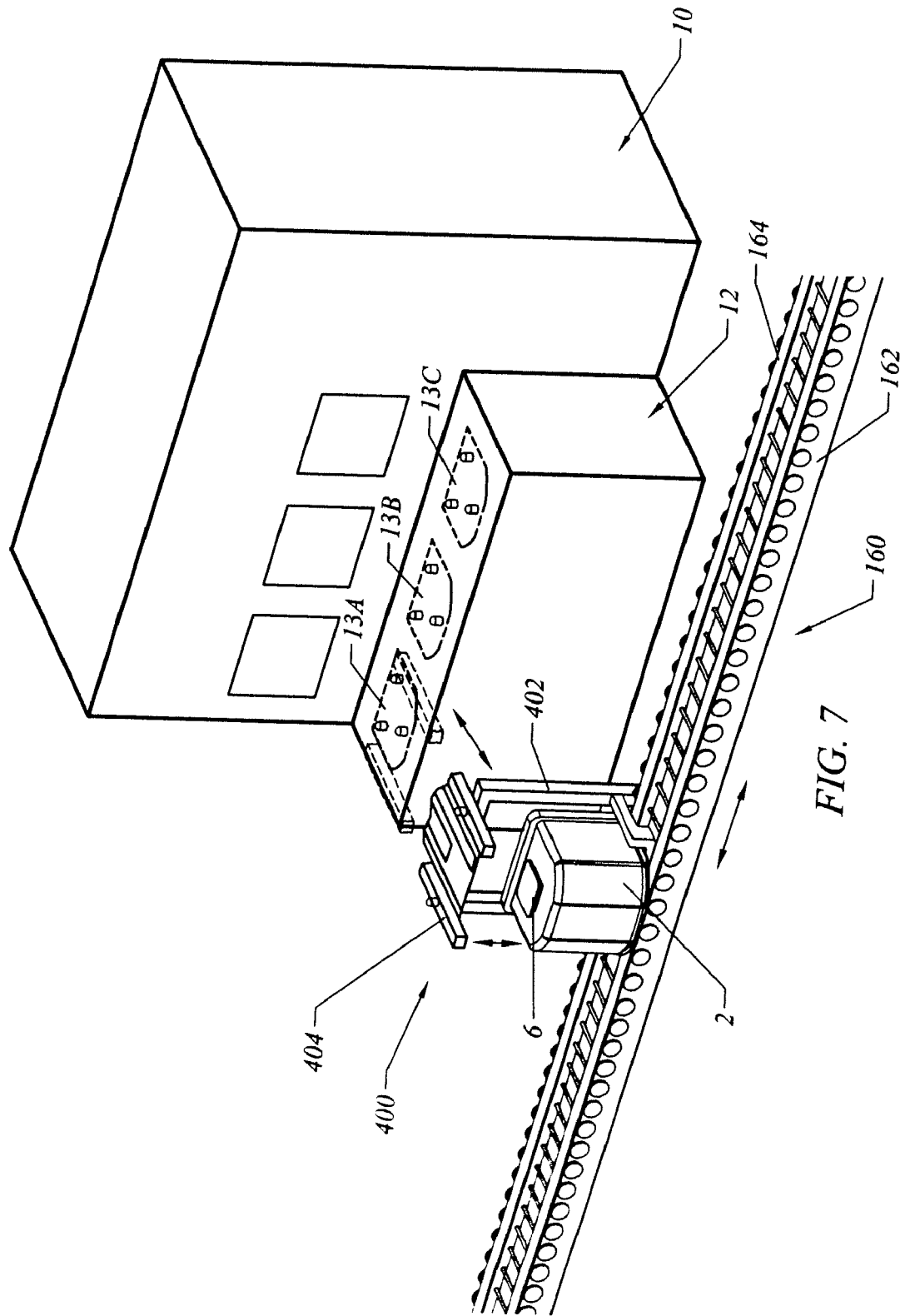
FIG. 7 provides a perspective view of an embodiment of the present invention, illustrating still another embodiment of a transfer arm mechanism.

FIG. 7 illustrates a FOUP transfer device 400. In this embodiment, the transfer device 400 includes a z-axis slide mechanism 402, a y-axis slide mechanism (not shown) and FOUP supports 404. In this embodiment, each FOUP support 404 includes a registration pin that engages the bottom surface of the FOUP 2 when the FOUP supports 404 lift the FOUP 2 off the conveyor 160. The z-axis slide mechanism 402 moves the FOUP supports 404 between a position whereby the FOUP supports 404 are nested in the conveyor 160 and a raised height. The y-axis slide mechanism moves the FOUP supports 404 between the raised position and the load port such that a FOUP 2 may be loaded and/or unloaded from the load port 12.

In operation, the z-axis slide mechanism 402 moves the FOUP supports 404 to a lowered position whereby a FOUP 2 traveling on the conveyor 160 may pass unobstructed over the FOUP supports 404. In one embodiment, the conveyor rail 164 includes a notch to accommodate each FOUP support 404 to pass through the rail 164. After a FOUP 2 comes to rest over the FOUP supports 404, the z-drive mechanism raises the FOUP supports 404 to lift the FOUP 2 vertically from the conveyor 160 to a first height. The raised position is preferably a position whereby the bottom of the FOUP 2 will not contact the kinematic pins 18 when the FOUP is moved to a location directly over the kinematic plate 13. The y-axis slide mechanism then moves the FOUP 2 horizontally towards the process tool 10 until the FOUP 2 is located directly over the kinematic plate 13. The FOUP support arms 404 are preferably spaced wider apart than the kinematic plate 13 to allow the y-axis slide mechanism 404 to retract easily after a FOUP 2 is loaded onto the kinematic plate 13. The interface mechanism 400 shown in FIG. 7 may also be mounted on an x-axis drive mechanism to move the entire mechanism 400 parallel to the conveyor 160 and service multiple load ports and/or multiple kinematic plates of a single load port.

Figure 8:
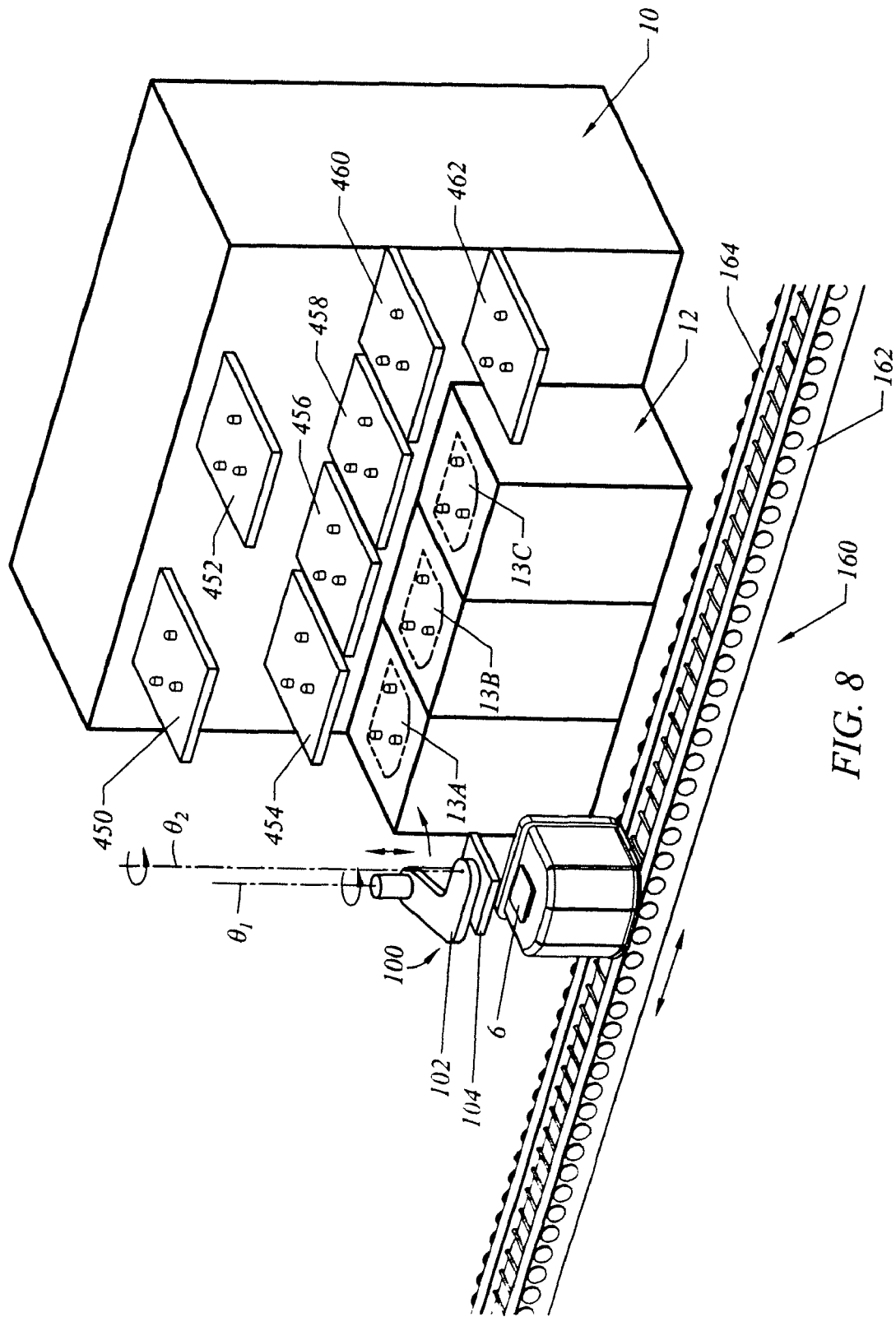
FIG. 8 provides a perspective view of the embodiment shown in FIG. 5 having a processing tool with additional storage shelves.
Figure 9:
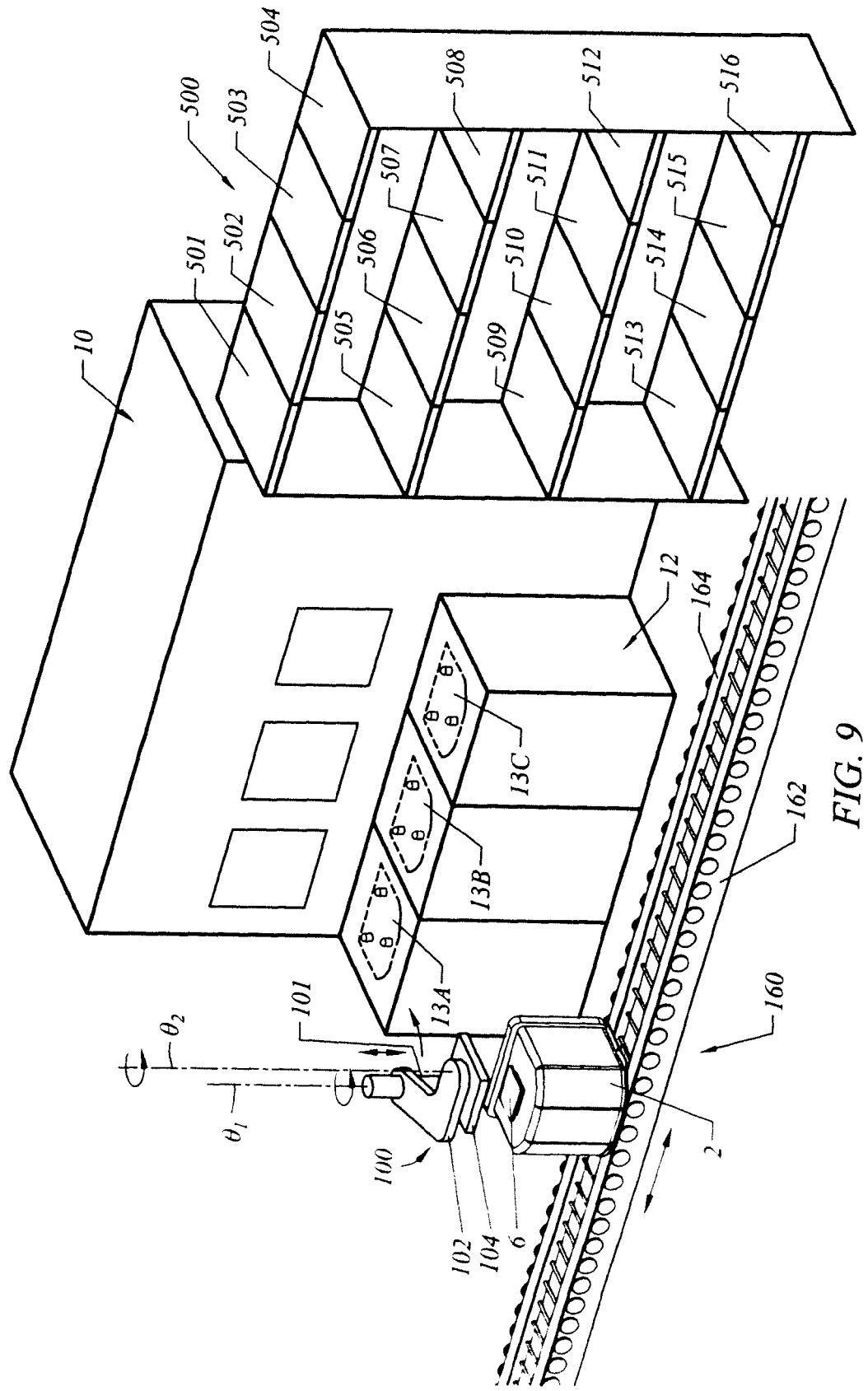
FIG. 9 provides a perspective view of the embodiment shown in FIG. 5 having additional storage locations adjacent the processing tool.
Figure 10:
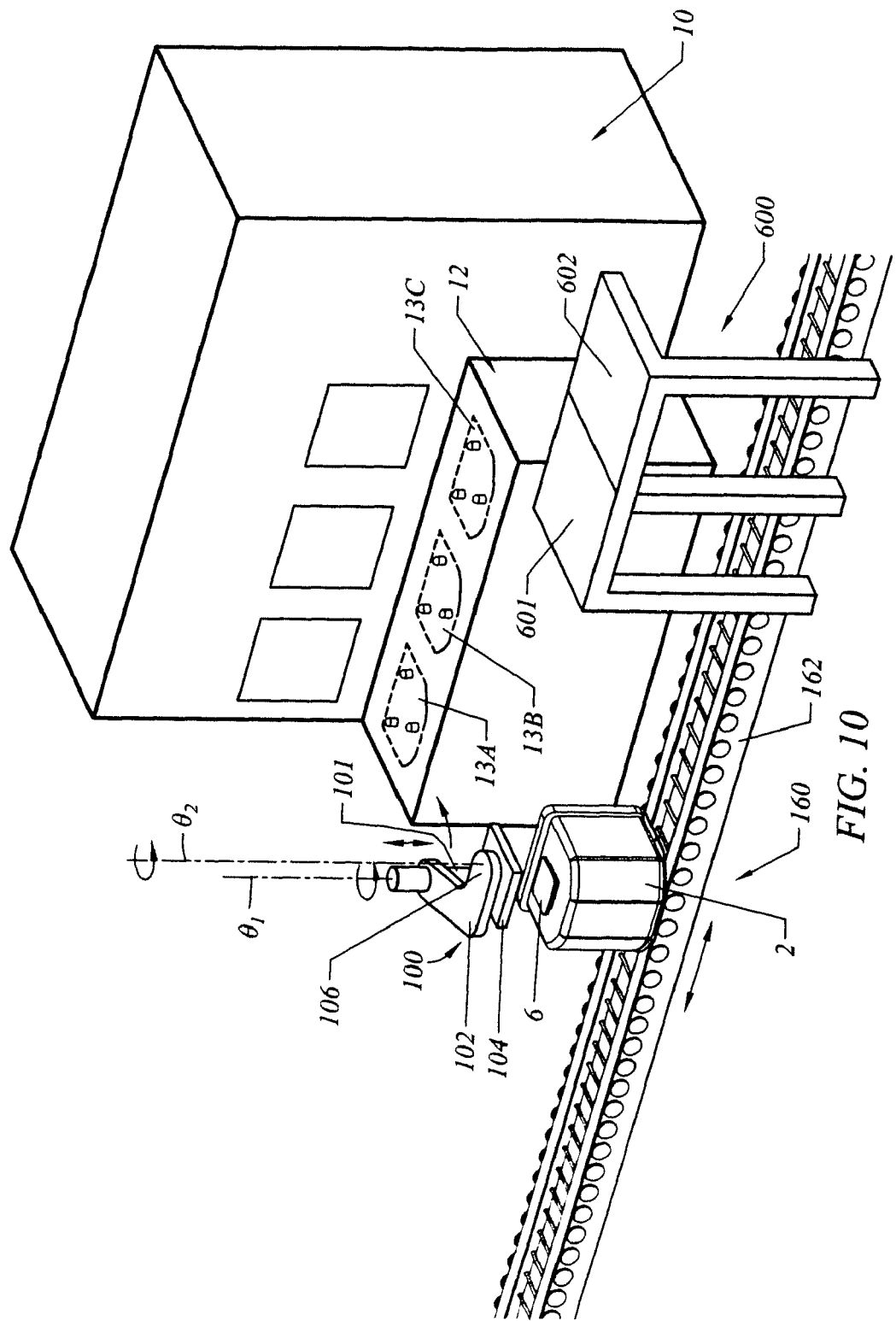
FIG. 10 provides a perspective view of the embodiment shown in FIG. 5 having additional storage shelves located substantially over the conveyor.

FIGS. 8, 9 and 10 illustrate various arrangements of storage shelves that may be accessed by the container transfer device.

For discussion purposes, only the container transfer device 100 shown in FIG. 4 will be described. However, it is within the scope of the invention to use any of the other transfer mechanisms disclosed in this application or an equivalent mechanism. FIGS. 8-10 illustrate that the storage shelves are similar to the kinematic plate—having kinematic pins. However, the storage shelves may comprise any configuration that will support a container.

FIG. 8 illustrates storage shelves 450-462 each mounted to the front face of the processing tool 10. Storage shelves 450-460 are located above the opening in the tool 10 and above the kinematic plates 13A, 13B and 13C. Storage shelf 462 is located adjacent kinematic plate 13C. The transfer mechanism 100 preferably has the range in the x-direction and z-direction to remove a FOUP 2 from the conveyor 160 and place the FOUP 2 on any of the storage shelves 450-462. The tool 10 may have any number of storage shelves. And the storage shelves may receive a FOUP intended for this tool or for any other tool in the facility.

FIG. 9 illustrates that the FOUP transfer device 100 may access storage shelves 501-516 that are located adjacent to the processing tool 10. The shelves 501-516 could be used for container storage associated specifically with the tool 10 or for general storage. The container transfer mechanism 100 may be able to access a FOUP 2 stored on any one of the shelves or a separate transfer mechanism may be dedicated for moving FOUPS into and out of the storage shelves. As an independent storage system, the dedicated loading mechanism would only transfer FOUPs between the conveyor 160 and any one of the storage shelves 501-516.

FIG. 10 illustrates that storage shelves 601 and 602 may also be located directly over the conveyor 160. These shelves provide a loading station for either an operator to manually load a FOUP or an OHT system to load a FOUP and/or for buffering and storage. The storage shelves 601 and 602 may be located directly in front of the load port 12. However, some combinations of access from the conveyor 160 to the load port 12 may be restricted. For example, a process tool 10 may have three manual loading stations (e.g., similar to shelves 601 and 602)—each one located in front of a kinematic plate (e.g., kinematic plates 13A, 13B and 13C). In this case, a transfer device 100 that cannot lift a FOUP above other FOUPs located on either a kinematic plate or a loading station may not be able to access the middle loading station if a FOUP was located on the first and last kinemtic plates 13A and 13C and on the first and last load stations 601 and 603. But this should never happen because a FOUP is often placed on a manual load station only if the corresponding kinematic plate in front of the load station is empty.

Figure 11A:
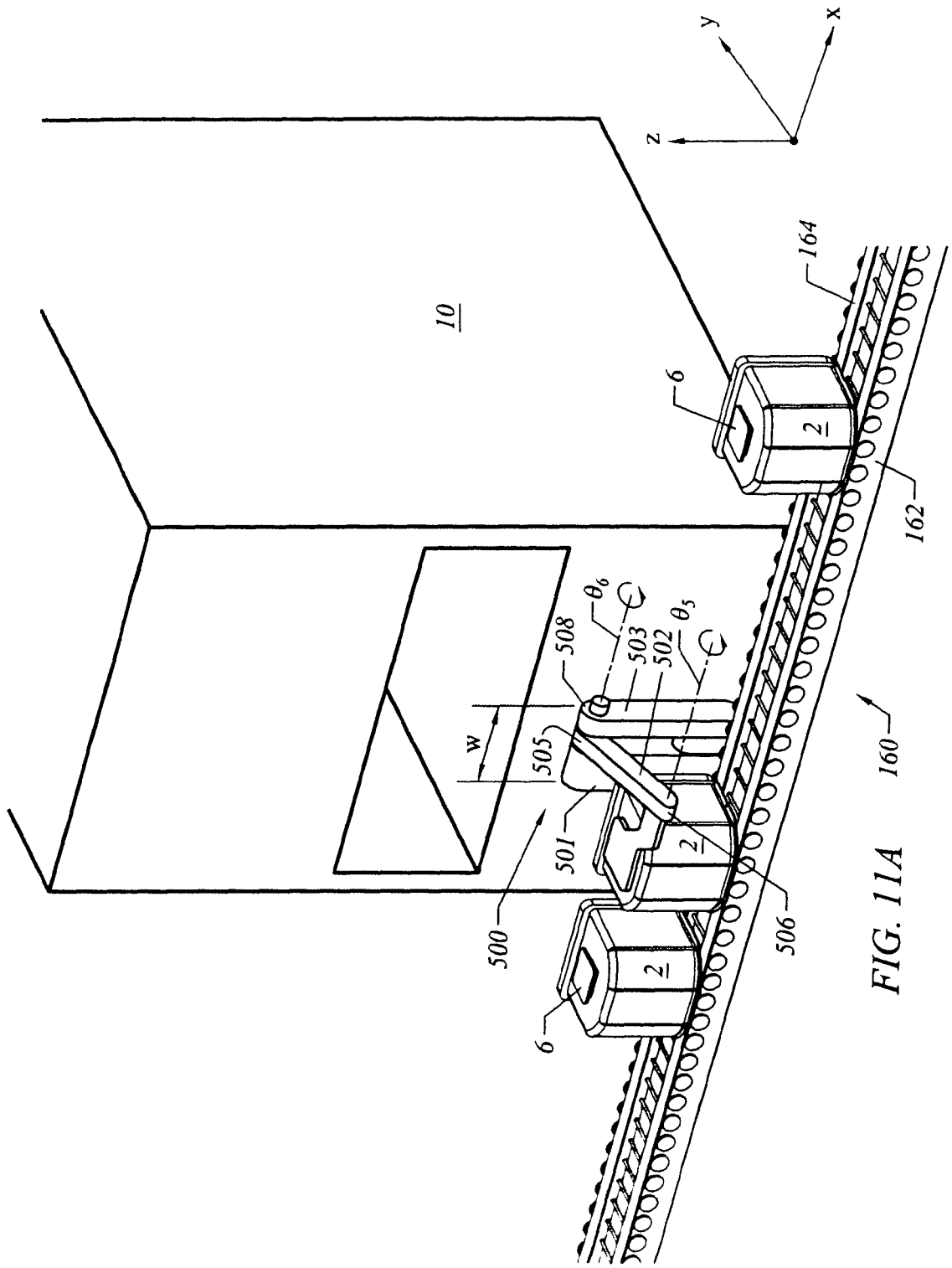
FIGS. 11A-11C each provides a perspective view of another embodiment of the present invention.
Figure 11B:
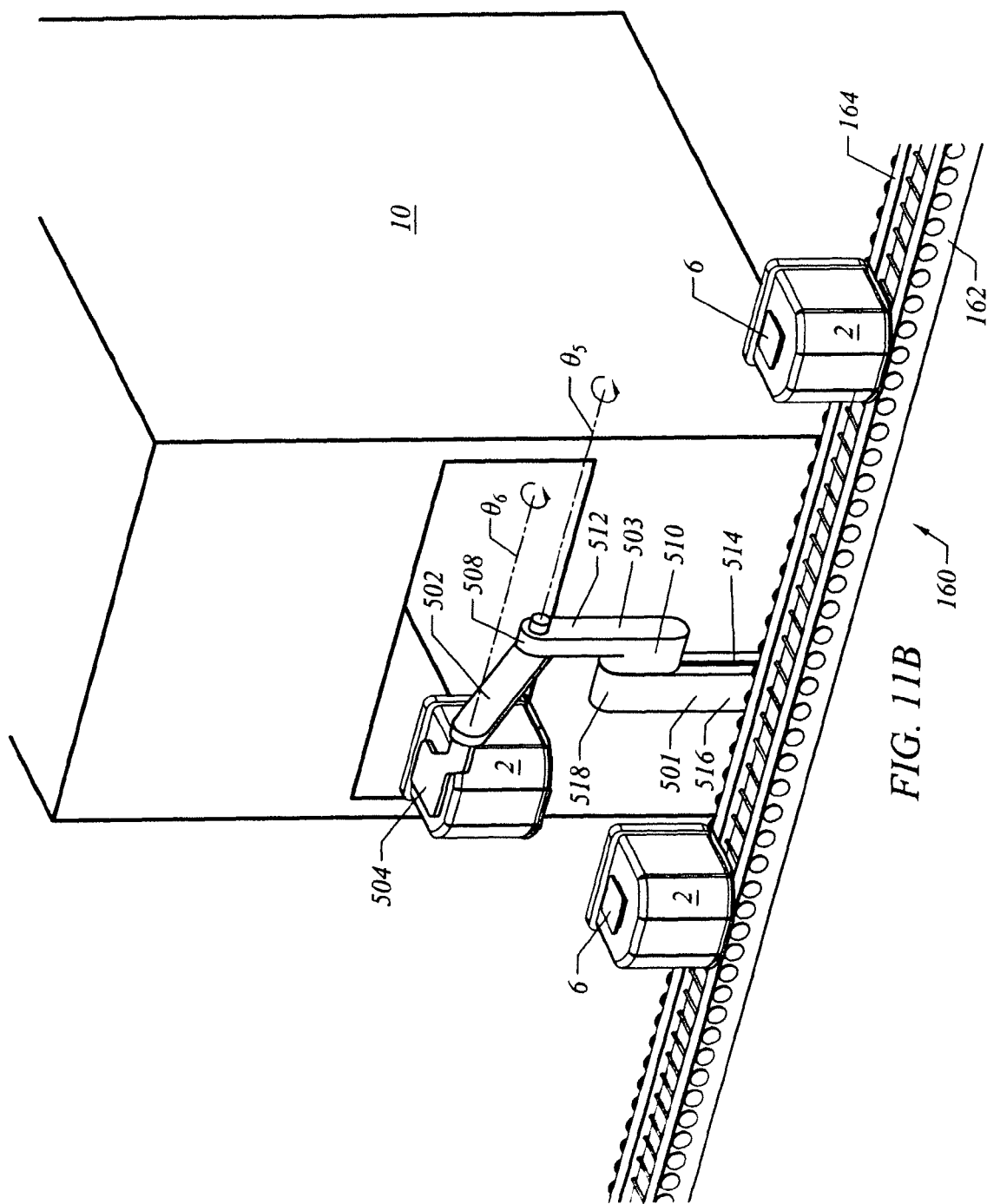
Figure 11C:
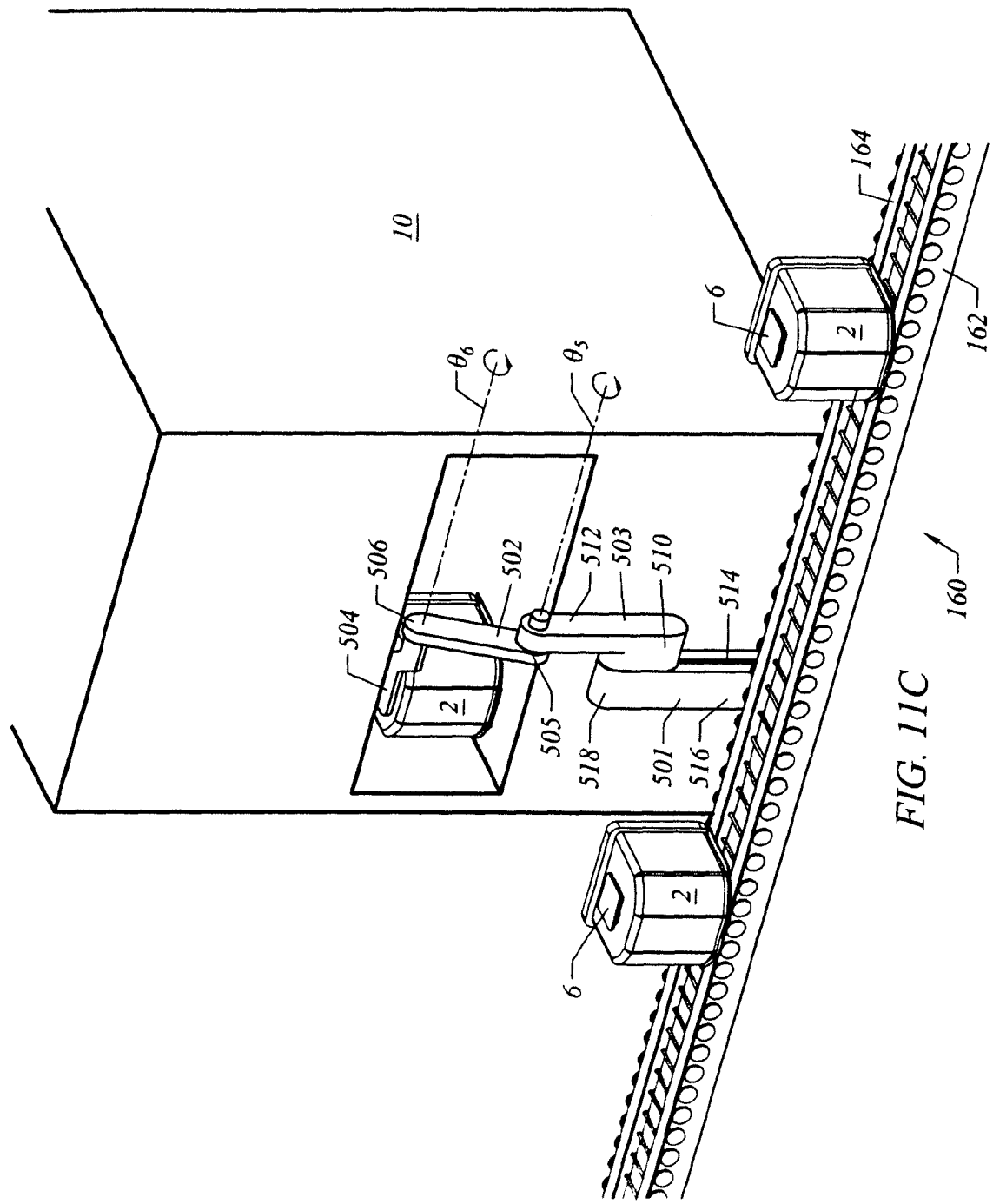

FIGS. 11A-11C each illustrates a tool load device 500. The tool load device 500 includes, among other things, a z-drive assembly enclosed in a housing 501, a shoulder 503, an arm 502 and a gripper 504. The shoulder 503, in this embodiment, is an elongated structure having a base 510 coupled with the z-drive assembly, and a distal end 512. The z-drive mechanism may comprise, by way of example only, a lead screw, a rack and pinion drive or a belt drive. The shoulder 503 moves substantially vertically between the base 516 and the distal end 518 of the housing 501.

The proximal end 505 of the arm 502 is rotatably coupled with the distal end 512 of the shoulder 503, and rotates about a $\theta_6$ axis. The shoulder 503 includes, for example, a harmonic drive or gear drive, for controlling the rotational motion of the arm 502. Affixing the proximal end 505 of the arm 502 to the distal end 508 of the shoulder 503 presets the $\theta_6$ axis (or wrist joint) at a predetermined height when the shoulder 503 is located in the lowermost position (as shown in FIG. 11A).

Thus, the tool load device 500 is able to have a reduced height housing 501 (e.g., less than the 900 mm height of the load port shelf). The base 510 of the shoulder 503 is wider than the distal end 512 of the shoulder 503 so that the proximal end 505 of the arm 502 rotates between the shoulder 503 and the housing 501. This feature allows the width W of the tool load device 500 to be as compact as possible. The arm 502 may also be rotatably mounted on the outside of the shoulder 503 (opposite side as shown in FIGS. 11A-11C).

The range of motion for the arm 502 is preferably great enough to allow the arm 502 to at least move between the position shown in FIG. 11A (load/unload the FOUP 2 from the conveyor 160) and the position shown in FIG. 11C (load/unload the FOUP 2 from the tool 10). In one embodiment, the preferred range of motion of the arm 502 is between 45° and 190°—with 0° pointing the distal end 506 of the arm 502 directly at the proceeding tool (e.g., the arm 502 is substantially horizontal).

A gripper 504 is rotatably mounted the distal end 506 of the arm 502 to form an "elbow" joint that rotates about a $\theta_5$ axis. In one embodiment, the $\theta_5$ axis is not an independent axis—creating a gripper 504 that rotates in direct relation to the arm 502. The rotation of the gripper 504 may be directly linked to the rotation of the arm 502 through, for example, a belt, chain or band that travels through the arm 502. The gripper 504 may also rotate independently of the arm 502. Regardless, the rotation about the $\theta_5$ axis and the $\theta_6$ axis are preferably coordinated to ensure that the wafers stored in the FOUP 2 remain level at all times.

In operation, the arm 502 may rest in any location as an idle position that preferably allows a FOUP 2 traveling on the conveyor 160 to pass unobstructed by the tool load device 500. After a FOUP 2 comes to rest on the conveyor 160 in front of the tool load device 500, the arm 502 is then rotated downward until the gripper 504 contacts the top handle 6 of the FOUP 2 seated on the conveyor 160 (see FIG. 11A). The gripper 504, in this embodiment, then grips the top handle 6 of the FOUP 2. It is within the scope of the present invention for the gripper 504 to grip other parts of the FOUP 2 such as, but not limited to, the side handles or the bottom surface of the FOUP. Through a combination of vertical motion by the shoulder 503 and the rotation of the arm 502, the tool load device 500 begins to move the FOUP 2 off of the conveyor 160 (see FIG. 11B). As discussed above, this coordinated motion preferably maintains the wafers located within the FOUP at a substantially horizontal orientation to prevent damaging the wafers. FIG. 11C illustrates the tool load device 500 placing the FOUP 2 on the load port or processing tool shelf. The tool load device 500 moves the FOUP 2 between the conveyor 160 and the tool 10 over the distal end 518 of the housing 501. The tool load device 500 may also be adapted to load/unload a FOUP 2 from other transport systems such as an RGV, AGV or PGV.

The housing 501 and the shoulder 503 of the tool load device 500 are preferably located between the conveyor 160 and the tool 10. With this location, the tool load device 500 may be adapted to move along the x-axis (parallel to the conveyor 160). The x-axis drive mechanism (see FIGS. 12-13) may include any mechanism known within the art such as, but not limited to, a rack and pinion system or a plastic tire friction drive.

Figure 12A:
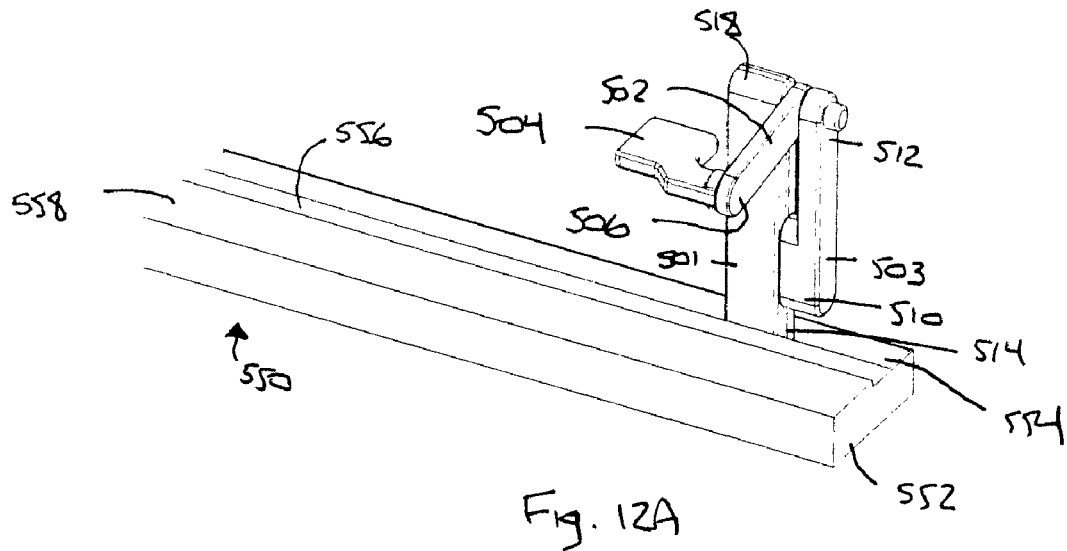
FIGS. 12A-12B each provide a perspective view of another embodiment of the present invention, illustrating an x-axis drive assembly.
Figure 12B:
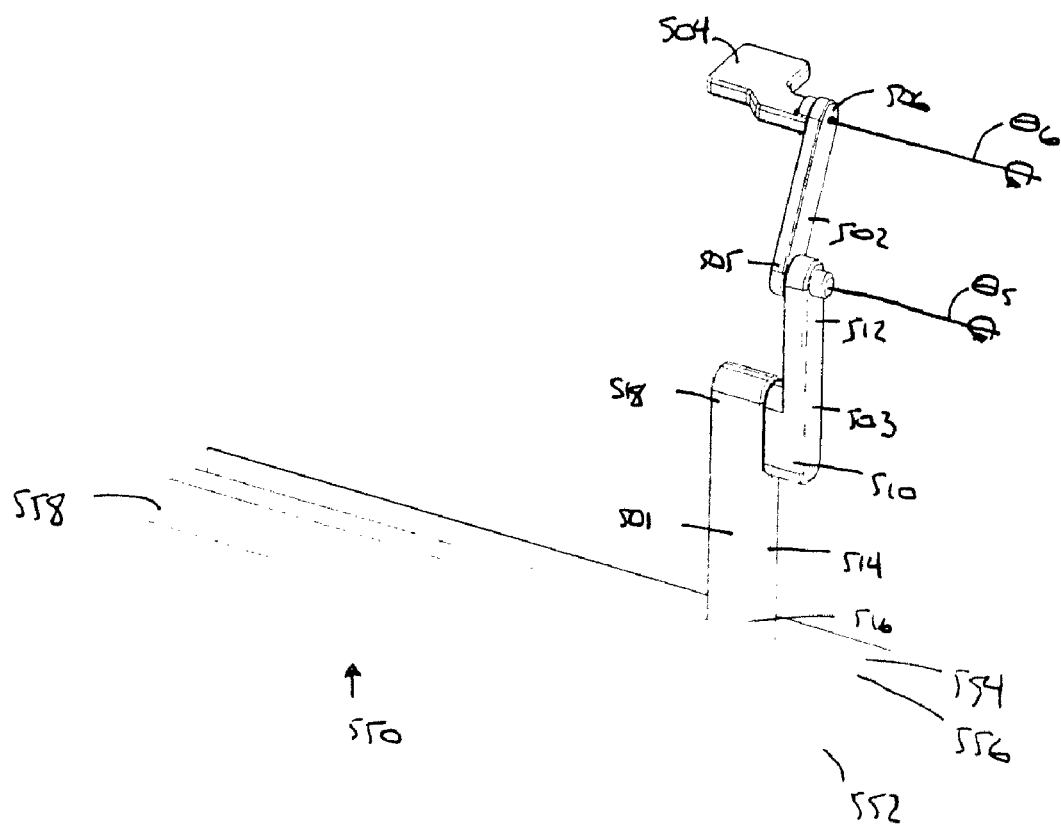

FIGS. 12-13 illustrate the x-drive assembly 550 and the relationship between the x-drive assembly 550 and the conveyor 160. The x-drive assembly 550 includes a housing 552 that has a tool load device track 554 and various conveyor support and/or registration features 556 and 558. If the tool load device 500 is a stationary device (e.g., only services a single load port), the section of the conveyor 160 passing the load port, in this embodiment, is supported by conveyor support brackets 580 (see FIGS. 13C-13D). These brackets 580 raise the conveyor 160 off the facility floor. When the tool load device 500 services multiple load ports, the x-drive assembly 550 may be placed underneath the section of the conveyor 160 passing by each of these load ports. The length of the x-drive assembly 550 may vary and is determined by the distance the tool load device must travel along the x-direction. The housing 552 of the x-drive assembly 550 provides support for the section of conveyor—replacing the conveyor support brackets 580 for this particular section of conveyor 160.

The housing 552 of the x-drive assembly 550 contains registration features that hold the conveyor 160 in place, such as channel 556 and support surface 558. The specific features of the housing 552 may vary and are dependent on the particular type of conveyor 160. The conveyor 160, in this embodiment, is seated on the housing 552 such that the housing 501 of the tool load device 500 housing 552 of the x-drive assembly 550 provides moves along the x-direction within the slot or channel 554—adjacent to the conveyor 160. The housing 501 of the tool load device 500 is coupled with a drive system, such as a lead screw, enclosed within the housing 552 of the x-drive assembly 550. Other drive mechanisms known within the art are within the scope of this invention such as, but not limited to, a belt drive or rack and pinion gear system.

All of the previous descriptions are described in relation to a floor-based conveyor. However, the conveyor 160 could be replaced with a rail guided vehicle (shuttle). It should be appreciated that the above-described mechanisms and process for FOUP transport between a conveyor and a load port are for explanatory purposes only and that the invention is not limited thereby. Having thus described a preferred embodiment of a method and system for FOUP transportation, it should be apparent to those skilled in the art that certain advantages of the within system have been achieved. It should also be appreciated that various modifications, adaptations, and alternative embodiments thereof may be made within the scope and spirit of the present invention. For example, the use of conveyors has been illustrated in a semiconductor fabrication facility, but it should be apparent that many of the inventive concepts described above would be equally applicable to the use of other non-semiconductor manufacturing applications.

The invention claimed is:

1. An apparatus for transferring a container between a container transfer system and a processing tool, comprising:
   a housing located below a processing tool shelf, the housing substantially enclosing a drive mechanism configured to move substantially vertically between top and bottom ends of the housing;
   an arm support outside the housing, the arm support having a base coupled with the drive mechanism and a distal end at an opposite end of the base, the distal end being higher than the top end of the housing when the drive mechanism is at the top end of the housing;
   an arm having a proximal end and a distal end, the proximal end of the arm being rotatably coupled with the distal end of the arm support;
   a gripper rotatably coupled with the distal end of the arm;
   an x-drive assembly for moving the housing substantially along an x-direction,
   wherein the container transfer system is configured to convey the container from a first position in the container transfer system in front of the housing to a second position above the housing and to the processing tool shelf,
   wherein the container configured to travel in the transfer system that is located in front of the processing tool is configured to travel in the x-direction,
   wherein the container transfer system comprises a conveyor,
   wherein the x-drive assembly is configured to move the housing along the x-direction and is configured so that the housing is located between the conveyor and the processing tool when the housing moves, and
   wherein the x-drive assembly supports the conveyor.

2. The apparatus as recited in claim 1, wherein the proximal end of the arm is located between the distal end of the arm support and the housing.

3. The apparatus as recited in claim 1, wherein the drive mechanism comprises a lead screw.

4. The apparatus as recited in claim 1,
   wherein the gripper secures the container by the container's top handle.

* * * * *